(12) United States Patent
Hinrichs et al.

(10) Patent No.: US 7,301,392 B2
(45) Date of Patent: Nov. 27, 2007

(54) TUNABLE RESONATOR FOR USE IN ACTIVE-RC CONTINUOUS-TIME FILTERS

(75) Inventors: Jeffrey M. Hinrichs, San Diego, CA (US); William R. Goyette, San Marcos, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 155 days.

(21) Appl. No.: 11/203,579

(22) Filed: Aug. 10, 2005

(65) Prior Publication Data

US 2007/0046366 A1 Mar. 1, 2007

(51) Int. Cl.
*H03K 5/00* (2006.01)
(52) U.S. Cl. ...................... 327/553; 327/336
(58) Field of Classification Search ........ 327/551–559, 327/336
See application file for complete search history.

(56) References Cited

U.S. PATENT DOCUMENTS

| | | | |
|---|---|---|---|
| 5,028,884 A * | 7/1991 | Kondo et al. .............. | 330/305 |
| 5,729,230 A * | 3/1998 | Jensen et al. .............. | 341/143 |
| 5,994,966 A * | 11/1999 | Stikvoort .................... | 330/306 |
| 6,346,860 B2 * | 2/2002 | Stikvoort .................... | 330/303 |
| 2003/0042984 A1 | 3/2003 | Moloudi et al. | |

FOREIGN PATENT DOCUMENTS

EP 1 282 227 A2 2/2003

OTHER PUBLICATIONS

European Search Report for corresponding EP 06 01 6324, completed Apr. 4, 2007.
Yamazaki A et al: "*An Active-RC Reconfigurable Lowpass-Polyphase Tow-Thomas Biquad Filter*"; Circuits and Systems, 2004. MWSCAS '04. The 2004 47th Midwest Symposium on Hiroshima, Japan Jul. 25-28, 2004, Piscataway, NJ, USA, IEEE, vol. 1, Jul. 25, 2004, pp. 157-160, XP010738961 ISBN: 0-7803-8346-X; Figs. 2, 6; Chapter 2-3.
Jurgen A E P Van Engelen et al: "*A Sixth-Order Continuous-Time Bandpass Sigma-Delta Modulator for Digital Radio IF*"; IEEE Journal of Solid-State Circuits, IEEE Service Center, Piscataway, NJ, US, vol. 34, No. 12, Dec. 1999 XP011061155, ISSN: 0018-9200; Fig. 6; Chapter VI.

* cited by examiner

*Primary Examiner*—Dinh T. Le
(74) *Attorney, Agent, or Firm*—Tarolli, Sundheim Covell & Tummino LLP

(57) ABSTRACT

An integrated circuit (IC) resonator in which resonator parameters potentially affected by IC fabrication processes are correctable after fabrication. Resonance frequency tuning is effected by forming each feedback capacitor in a pair of integrator circuits to include a variable capacitance device, such as a varactor diode. A tuning signal is applied to the varactor diode to adjust the total capacitance value and, therefore, the resonance frequency. Similarly, the quality (Q) factor of the resonator is adjusted by providing a variable capacitance in an RC (resistance-capacitance) network coupling the output of one of the integrator circuits to the input of the other. The variable capacitance in the RC network permits adjustment of phase in the event that the integrator circuits do not provide a desired 180° total phase shift.

10 Claims, 1 Drawing Sheet

TUNABLE RESONATOR FOR USE IN ACTIVE-RC CONTINUOUS-TIME FILTERS

BACKGROUND OF THE INVENTION

This invention relates generally to continuous-time filters and, more particularly, to resonators that are critical components in continuous-time filters. A continuous-time filter operates on continuously varying (analog) signals rather than discrete digital signal samples. Although digital signal processing is widely used in communication systems and other applications, there is still a need for continuous-time filters to perform certain critical functions, such as at the point of analog-to-digital (A/D) conversion. One specific area in which the accurate tuning of active filters is important is the world of continuous-time delta-sigma analog-to-digital converters. This type of A/D converter contains at its core a continuous-time "loop filter." A loop filter is typically composed of a number of resonators that create transfer function "poles" at specific frequencies. The pole frequency (resonant frequency) and Q (quality) value of each resonator are critical factors in ensuring that that the overall closed loop A/D converter is stable and subject to only low noise in a frequency band of interest.

By way of further background, it is worth noting that although filter circuits are often characterized in terms of their frequency response and their characteristics in the time domain, they are typically analyzed and designed in terms of their characteristics in the "s-domain" or "s-plane," a plane in which a time-domain signal x(t) can be represented as an s-domain signal, which is a function of s, where s is a complex variable in the well known Laplace transform that relates any time-domain signal to its corresponding s-domain form. One of the advantages of representing a continuous-time filter in the s-domain is that the characteristics of the filter can be depicted in the s-plane as points known as poles and zeros. In such a "pole-zero plot," as it is known, each pole is a point in the s-plane at which the transfer function of the filter becomes very large, and each zero is a point in the s-plane at which the transfer function of the filter falls to near zero. The frequency response of the filter is represented in the s-plane by the variation of the transfer function along the imaginary axis of the s-plane. Therefore, for a resonator circuit a pole on the imaginary axis of the pole-zero plot corresponds to a resonant frequency in the frequency response of the circuit.

The design of continuous-time filters is complicated by the fact that integrated circuit process variations and other factors can skew the filter's most important figures of merit (e.g. the center frequency, bandwidth, and Q factor) such that the constructed end product does not meet the design specification. For example, the accuracy of an integrated filter designed using active-resistor-capacitor (active-RC) techniques depends greatly on the accuracy of the resistors and capacitors available. These components commonly vary by as much as 10-20% from their nominal values in an integrated circuit (IC) environment. There is a need, therefore, for a tuning technique that can compensate for these inaccuracies so that the finished filter can meet the design criteria. The present invention is directed to this end.

SUMMARY OF THE INVENTION

The present invention resides in a tunable resonator of which certain parameters adversely affected by integrated-circuit (IC) fabrication processes may be corrected after fabrication. Briefly, and in general terms, the invention is embodied in a tunable resonator for use in RC (resistance-capacitance) continuous-time filters, comprising a pair of integrator circuits interconnected in a loop to provide resonance at a selected resonance frequency. Each of the integrator circuits comprises an operational amplifier (often abbreviated to "opamp") with feedback capacitors, and with resistors for coupling output signals from one opamp to input lines of the other opamp. The integrator circuits are implemented in integrated circuit (IC) form and the resonator further comprises means for tuning the selected resonance frequency after fabrication of the resonator, and means for tuning the Q (quality) factor of the resonator after fabrication.

More specifically, the means for tuning the selected resonance frequency comprises means for adjusting at least one of either capacitor values or resistor values in each of the integrator circuits. In the embodiment of the invention disclosed by way of example, the means for tuning the selected resonance frequency comprises a variable capacitance component coupled to each of the feedback capacitors and means for applying a tuning signal to the variable capacitance component to vary the total capacitance value and thereby tune the resonance frequency. The variable capacitance component may be a varactor diode, in which case the tuning signal is applied to the varactor diode to change a reverse-bias voltage applied to the diode.

In the disclosed embodiment of the invention, the means for tuning the Q factor of the resonator comprises means for adding capacitance to the coupling resistors between the pair of integrator circuits and means for adjusting the amount of added capacitance and, therefore, the degree to which a phase adjustment is made to the signals coupled from one of the integrator circuits to the other. In particular, the means for adding capacitance to the coupling resistors comprises at least one varactor diode included in an RC network coupling one of the integrator circuits to the other. The means for adjusting the amount of added capacitance is a variable source of bias voltage applied to the varactor diode or diodes to vary their capacitance value.

The invention may also be defined as a method for making and tuning a resonator circuit in a continuous-time filter fabricated as an integrated circuit (IC). Briefly, the method comprises the steps of forming a resonator circuit from a pair of integrator circuits connected in a continuous loop to provide a total of 180° of phase shift; forming a plurality of feedback capacitors for each of the integrator circuits to include a variable capacitance; applying a tuning signal to the variable capacitance to tune the circuit to a selected resonance frequency; forming a resistance-capacitance (RC) network between a first of the integrator circuits and the second of the integrator circuits, to include at least one additional variable capacitance; applying a second tuning signal to the additional variable capacitance, to apply a phase shift to signals coupled from the first of the integrator circuits to the second, and thereby adjusting the Q factor associated with the resonator circuit. The method may further comprise the step of adding a resistance value to at least one of the feedback capacitors, to apply a phase shift to signals in the resonator circuit.

It will be appreciated from the foregoing that the present invention represents a significant advance in the field of continuous-time filters. In particular, the invention allows for post-fabrication tuning of filters implemented in integrated-circuit form, and thereby eliminates possible filter performance degradation as a result of fabrication processes. Other aspects and advantages of the invention will become

DETAILED DESCRIPTION OF THE INVENTION

Figure 1:
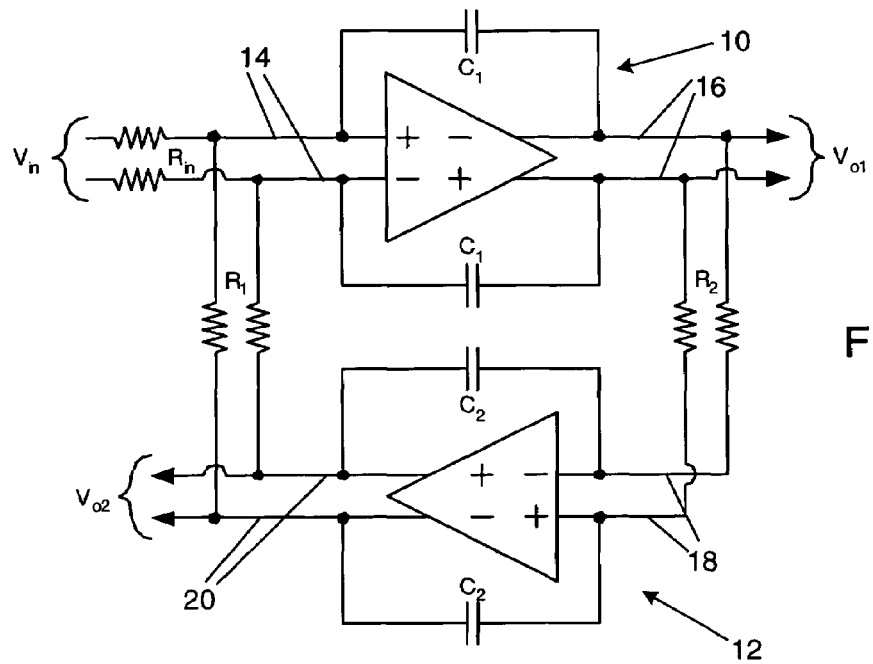
FIG. 1 is a schematic diagram of an active-RC resonator of the prior art.

As shown in the drawings for purposes of illustration, the present invention is concerned with active-RC resonators, which may be advantageously used in continuous-time filters. As briefly discussed above, active filters are important components in continuous-time delta-sigma analog-to-digital (A/D) converters. This type of A/D converter contains a continuous-time loop filter that is typically composed of a number of resonators, each of which is made up of circuit components selected to provide desired resonator parameters, such as Q factor and center frequency. When these resonators are fabricated in integrated-circuit (IC) form, the circuit components may vary as much as 10-20% from their nominal values and, in prior art resonators of this type, there was no way to tune the resonator parameters after fabrication.

A prior-art active-RC resonator is shown in FIG. 1 as including two operational amplifiers (opamps), indicated generally by reference numerals 10 and 12, configured as integrators connected in a feedback loop. Those skilled in the art will understand that one way to create a pole on the imaginary axis is to connect two integrator blocks in a feedback loop such that the phase shift around the loop is as close as possible to 180°. Integrator blocks ideally have a constant 90° of phase shift. Therefore, two integrators in cascade produce a constant 180° of phase shift. The integrator blocks in FIG. 1 are composed of the fully differential opamps 10 and 12, together with various resistors and capacitors.

More specifically, opamp integrator block 10 receives a differential input signal $V_{in}$ over input lines 14, through input resistors $R_{in}$ connected in series with the input lines. Opamp 10 has two feedback capacitors $C_1$ coupling the opamp 10 output lines 16 to its input lines 14. The output lines 16, with output voltage $V_{o1}$ are also coupled through resistors $R_2$ to input lines 18 of opamp 12, which has output lines 20 with output voltage $V_{o2}$. Opamp 12 also has feedback capacitors $C_2$ between its output lines 20 and its input lines 18. To complete the loop, the output lines 20 of opamp 12 are coupled through resistors $R_1$ to the input lines 14 of opamp 10.

It can be shown that the center frequency of the resonator, assuming that $R_1=R_2=R$ and $C_1=C_2=C$ is $1/(2\pi RC)$. It is obvious then, that the tuning of the resonator is highly dependent on the accuracy of the realized resistor and capacitor values. If either R or C can be made electrically adjustable post-fabrication, the resonator center frequency can be tuned to any desired frequency within some preferred range.

Another important way in which the resonator may deviate from ideal is that the integrator blocks are typically not perfect 90° phase shifters. The actual phase shift may be in error by as much as a few degrees in either direction. In addition, the integrator phase shift may have a slight variation with frequency. This inaccuracy in the integrator phase response will degrade the quality factor, Q, of the resonator. Generally, a high-Q resonator will peak more sharply at resonance than a low Q one. Ideally, the pole created by the resonator lies exactly on the imaginary axis of the s-domain representation of the resonator characteristics. When the phase shift around the resonator loop is not exactly 180 degrees, the pole moves to the left or to the right of the imaginary axis. If the pole moves to the right of the imaginary axis, the circuit is mathematically unstable and will oscillate. If the pole moves to the left of the imaginary axis, the circuit is stable but the peak value at resonance will decrease. In a continuous-time delta-sigma A/D converter, a minimum level of resonance is required for the overall data converter to meet the effective number of bits (ENOB) design specification. Therefore, in addition to being able to tune the resonator center frequency, it is also necessary to tune the resonator Q factor by incorporating some electrically adjustable lead or lag compensation.

Figure 2:
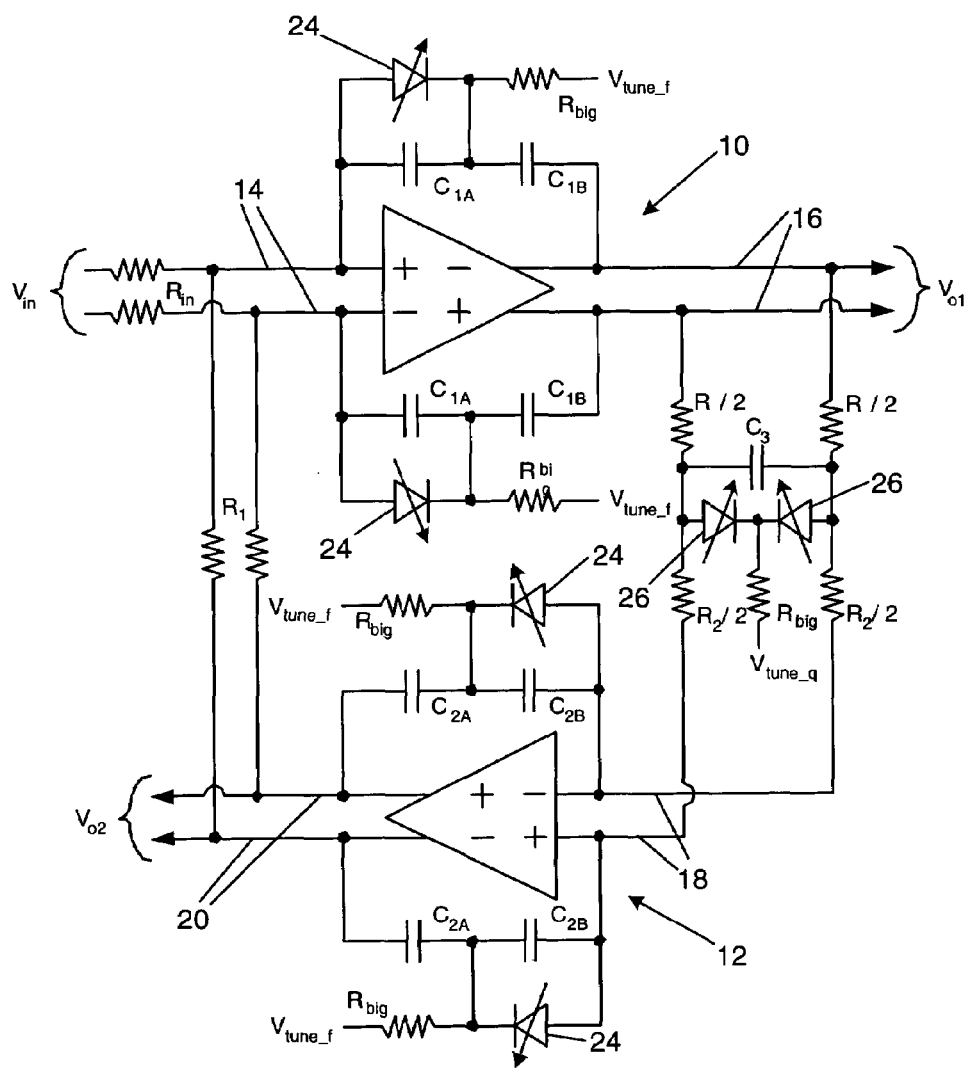
FIG. 2 is a schematic diagram of a tunable active-RC resonator in accordance with the present invention.

FIG. 2 shows a resonator configured in accordance with the invention, including modifications that allow both the resonance frequency and the Q factor to be electrically tuned post-fabrication. Two separate tuning operations are performed in the circuit of FIG. 2: frequency tuning and Q tuning.

First, frequency tuning is effected by varying the integrator capacitance values rather than the resistance levels. Each capacitor $C_1$ of FIG. 1 is replaced by series-connected capacitors $C_{1A}$ and $C_{1B}$ in FIG. 2. Each capacitor $C_{1A}$ has a varactor diode 24 connected across it in parallel, with the cathode of the varactor diode being connected to the junction between capacitors $C_{1A}$ and $C_{1B}$. A selectable DC bias voltage tuning signal $V_{tune\_f}$ is applied to the cathode of the varactor diode 24 through a large resistance $R_{big}$. Varactor diodes have inherent capacitance that can be varied by changing the reverse-bias voltage applied across the diode. Thus the varactor diode 24 functions to vary the total capacitance provided by the capacitors $C_{1A}$ and $C_{1B}$ and the varactor diode 24. Given that varactor diodes are often available in commercial IC processes, varying the integrator capacitance rather than the resistance is the presently preferred technique to effect frequency tuning. Similarly, in the other opamp circuit 12 each capacitor $C_2$ of FIG. 1 is replaced by series-connected capacitors $C_{2A}$ and $C_{2B}$ in FIG. 2, and each capacitor $C_{2A}$ has a varactor diode 24 connected across it in parallel. The tuning voltage signal $V_{tune\_f}$ is also applied to the cathode of the second varactor diode 24 through a large resistance $R_{big}$. Varactors are useful variable capacitance elements that are commonly used in voltage controlled oscillator (VCO) circuits. Varactors are basically specialized diodes whose capacitance is designed to vary significantly with reverse bias voltage. Varying the tuning voltage $V_{tune\_f}$ changes the net capacitance of the network, altering the integrator RC time constants, changing the resonance frequency of the entire circuit.

The frequency tuning circuit has the advantage that it allows the varactor DC bias voltage to be applied without disturbing the AC behavior of the rest of the circuit. In this invention, the varactor anode is connected to the opamp input, which is a virtual ground node. The frequency tuning voltage is applied to the varactor cathode through a large resistor $R_{big}$. This DC tuning voltage cannot affect the AC behavior of the rest of the resonator circuit because the DC cannot pass through the two fixed capacitors $C_{1A}$ and $C_{1B}$ or $C_{2A}$ and $C_{2B}$.

Resonator Q factor tuning is effected by the network in FIG. 2 composed of the four resistors $R_2/2$, capacitor $C_3$, another large resistor $R_{big}$, and two additional varactor diodes 26. This network takes the place of the two resistors $R_2$ in the prior-art circuit of FIG. 1. Specifically, each of the original resistors $R_2$ is replaced by two resistors $R_2/2$ connected in series. The capacitor $C_3$ is connected between the common junctions of each pair of resistors $R_2/2$. Also connected between these two junctions are the two additional varactor diodes 26, with their anodes connected to the respective resistor junctions and their cathodes connected in common to a tuning voltage $V_{tune\_q}$, through large resistor $R_{big}$. The capacitor $C_3$ and the varactor diodes 26 together form a tunable capacitance network. When the varactor diodes 26 are adjusted by the tuning voltage $V_{tune\_q}$, the capacitance network provides a small phase shift in the signal coupled from the output of opamp 10 to the input of opamp 12. This small amount of tuning allows the overall phase shift of the loop to approximate 180° more closely, which is the condition for good resonance. Since the tuning voltage $V_{tune\_q}$ is applied at a virtual ground node, the DC does not affect the normal AC operation of the rest of the resonator circuit. It should be noted that this circuit can only provide a phase delay, and will only allow the Q factor to be improved only if the nominal loop phase shift is less than 180°. If it is expected that the nominal phase shift will be greater than 180°, small fixed resistors can be inserted in series with capacitors $C_{1B}$ and $C_{2B}$ to bring the nominal loop phase shift back to something less than 180°, so that the phase delay added by the tuning circuit will improve the Q.

It will be appreciated from the foregoing that the present invention represents a significant improvement in continuous-time resonators. In particular, providing for post-fabrication tuning eliminates the potential inaccuracies and uncertainties resulting from integrated circuitry (IC) fabrication processes. It will also be appreciated that placing varactor diodes in the resonator circuit is not the only way to adjust resonance frequency and Q. It is also possible to make all of the capacitors fixed and incorporate some form of tunable resistance, since it is the RC product that determines the resonance frequency. This tunable resistance could take the form of a metal oxide semiconductor (MOS) transistor biased in the triode region. Unfortunately, the resistance provided by an MOS device in triode is very non-linear and may unacceptably distort any signal that passes through it. It is also possible to fabricate a binary array of fixed capacitors that can be switched in and out with MOS devices, but this technique uses a lot more IC "real estate" than the presently preferred approach described here.

It will be understood, therefore, that although a preferred embodiment of the invention has been described in detail for purposes of illustration, various modifications may be made without departing from the spirit and scope of the invention. Accordingly, the invention should not be limited except as by the appended claims.

The invention claimed is:

1. A tunable resonator for use in RC (resistance-capacitance) continuous-time filters, comprising:
   a pair of integrator circuits interconnected in a loop to provide resonance at a selected resonance frequency;
   each of the integrator circuits comprising an operational amplifier (opamp) with feedback capacitors, and resistors for coupling output signals to input lines of the other opamp;
   means for tuning the selected resonance frequency of the resonator after fabrication of the resonator, the means for tuning comprising means for adjusting at least one of capacitance values of the feedback capacitors and resistance values of the resistors; and
   means for tuning a Q (quality) factor of the resonator, the means for tuning coupled between the pair of the integrator circuits after fabrication of the resonator;
   wherein the integrator circuits are implemented in integrated circuit (IC) form.

2. A tunable resonator as defined in claim 1, wherein the means for tuning the selected resonance frequency comprises:
   a variable capacitance component coupled to each of the feedback capacitors; and
   means for applying a tuning signal to the variable capacitance component to vary the total capacitance value and thereby tune the resonance frequency.

3. A tunable resonator as defined in claim 2, wherein the variable capacitance component is a varactor diode and the tuning signal is applied to the varactor diode to change a reverse-bias voltage applied to the diode.

4. A tunable resonator as defined in claim 1, wherein the means for tuning the Q factor of the resonator comprises:
   means for adding capacitance to coupling resistors between the pair of integrator circuits; and
   means for adjusting the amount of added capacitance and, therefore, a degree to which a phase adjustment is made to signals coupled from one of the integrator circuits to the other.

5. A tunable resonator as defined in claim 4, wherein the means for adding capacitance to the coupling resistors comprises:
   at least one varactor diode included in an RC network coupling one of the integrator circuits to the other, wherein the means for adjusting the amount of added capacitance is a variable source of bias voltage applied to the at least one varactor diode to vary the capacitance value of the diode.

6. A tunable resonator for use in RC (resistance-capacitance) continuous-time filters, comprising:
   a pair of integrator circuits interconnected in a loop to provide resonance at a selected resonance frequency;
   each of the integrator circuits comprising a fully differential operational amplifier (opamp) with a pair of feedback capacitors, and a pair of resistors coupling output signals on output lines from one opamp to input lines of the other opamp;
   wherein the integrator circuits are implemented in integrated circuit (IC) form;
   wherein the resonator further comprises means for tuning the selected resonance frequency of the resonator after fabrication of the resonator, and means for tuning a Q (quality) factor of the resonator after fabrication of the resonator;
   wherein the means for tuning the selected resonance frequency comprises a variable capacitance component coupled to each of the feedback capacitors, and means for applying a tuning signal to the variable capacitance component to vary the total capacitance value and thereby tune the resonance frequency;
   and wherein the means for tuning the Q factor of the resonator comprises means for adding capacitance to the coupling resistors between a first and a second of the integrator circuits, and means for adjusting the amount of added capacitance and, therefore, a degree to which a phase adjustment is made to the output signals coupled from one of the integrator circuits to the other.

7. A tunable resonator as defined in claim 6, wherein the means for adding capacitance to the coupling resistors comprises:

a pair of varactor diodes included in an RC network coupling the first of the integrator circuits to the second, wherein the means for adjusting the amount of added capacitance is a variable source of bias voltage applied to the pair of varactor diodes to vary the capacitance value of the diode.

8. A tunable resonator as defined in claim 7, wherein the RC network coupling the first of the integrator circuits to the second comprises:
   a first pair of resistors connected in series to one output line from the first integrator circuit;
   a second pair of resistors connected in series to a second output line from the first integrator circuit; and
   a fixed capacitor connected between junction points of the first and second pairs of resistors;
   wherein the pair of varactor diodes have their cathodes connected in common and have their anodes connected to across the fixed capacitor;
   and wherein the variable source of bias voltage is applied to the cathodes of the varactor diodes, to vary the capacitance of the diodes and thereby affect the phase of signals coupled from the first of the integrator circuits to the second.

9. A method for making and tuning a resonator circuit in a continuous-time filter fabricated as an integrated circuit (IC), the method comprising:
   forming a resonator circuit from a pair of integrator circuits connected in a continuous loop to provide a total of 180° of phase shift;
   forming a plurality of feedback capacitors for each of the integrator circuits to include a variable capacitance;
   applying a tuning signal to the variable capacitance to tune the circuit to a selected resonance frequency;
   forming a resistance-capacitance (RC) network between a first of the integrator circuits and the second of the integrator circuits, to include at least one additional variable capacitance;
   applying a second tuning signal to the additional variable capacitance, to apply a phase shift to signals coupled from the first of the integrator circuits to the second, and thereby to adjust a Q factor associated with the resonator circuit.

10. A method as defined in claim 9, and further comprising:
   adding a resistance value to at least one of the feedback capacitors, to apply a phase shift to the signals coupled from the first of the integrator circuits to the second of the integrator circuits.

* * * * *